United States Patent [19]
Andoh

[11] Patent Number: 5,334,871
[45] Date of Patent: Aug. 2, 1994

[54] FIELD EFFECT TRANSISTOR SIGNAL SWITCHING DEVICE

[75] Inventor: Naoto Andoh, Itami, Japan

[73] Assignee: Mitsubishi Denki Kabushiki Kaisha, Tokyo, Japan

[21] Appl. No.: 88,580

[22] Filed: Jul. 9, 1993

Related U.S. Application Data

[63] Continuation of Ser. No. 766,121, Sep. 27, 1991.

[30] Foreign Application Priority Data

Oct. 9, 1990 [JP] Japan .................. 2-271639

[51] Int. Cl.$^5$ ...................... H01L 29/80; H01L 29/20
[52] U.S. Cl. .................... 257/402; 257/403; 257/275; 257/280; 257/394; 257/547; 333/247
[58] Field of Search ............... 357/22, 23.14, 42, 68, 357/46; 333/247; 257/402, 403, 275, 280, 394, 547

[56] References Cited

U.S. PATENT DOCUMENTS

| | | | |
|---|---|---|---|
| 4,456,888 | 6/1984 | Ayasli | 357/22 |
| 4,670,297 | 6/1987 | Lee et al. | 427/91 |
| 4,939,485 | 7/1990 | Eisenberg | 333/247 |
| 5,006,816 | 4/1991 | Koide | 357/23.14 |
| 5,023,677 | 6/1991 | Truitt | 357/68 |

FOREIGN PATENT DOCUMENTS

| | | |
|---|---|---|
| 0348998 | 1/1990 | European Pat. Off. . |
| 63-179771 | 8/1987 | Japan . |

OTHER PUBLICATIONS

Tan et al, "A Low Distortion K-Band GaAs Power FET", IEEE Transactions on Microwave Theory and Techniques, vol. 36, No. 6, Jun. 1988, pp. 1023-1032.

Chen et al, "Dual-Gate GaAs FET: A Versatile Circuit Component For MMICs", Microwave Journal, vol. 32, No. 6, Jun. 1989, pp. 125-135.

Macksey et al, "GaAs Power FET For K-Band Operation", IEEE International Solid-State Circuits Conference, vol. 24, Feb. 1981, pp. 70-71.

"Monolithic Dual-Gate GaAs FET Digital Phase Shifter", IEEE Transactions on Microwave Theory and Techniques, vol. MTT-30, No. 7, Jul. 1982.

Yalcin Ayasli, "Microwave Switching with GaAs FETs", Microwave Journal, Nov. 1982, pp. 61-74.

McGrath et al., "Multi Gate FET Power Switches", Applied Microwave, Summer 1991, pp. 77-86.

Raymond S. Pengelly, "Using GaAs MMICs as Control Devices", MSN, Apr. 1989, pp. 18-28.

*Primary Examiner*—Jerome Jackson
*Attorney, Agent, or Firm*—Leydig, Voit & Mayer

[57] ABSTRACT

A field effect transistor signal switching device includes a semiconductor substrate including an active region; an input electrode disposed on the substrate and including a source electrode disposed on the active region and a source pad; first and second output electrodes respectively including first and second drain electrodes disposed on the active region; and first and second control electrodes disposed on the substrate for controlling the selective transmission of an input signal applied to the input electrode to the first and second output electrodes, the first and second control electrodes respectively including first and second gate electrodes disposed on the active region between the source electrode and the first and second drain electrodes, respectively, first and second gate pads, and first and second connecting portions disposed on the substrate respectively electrically connecting the first and second gate electrodes to the first and second gate pads. An input line is connected to the source pad, first and second collinear output lines perpendicular to the input line are connected to the first and second output electrodes, respectively, and first and second control lines are connected to the first and second gate pads, respectively. In one embodiment, the first and second control lines are disposed on opposite sides of the first output line and generally parallel to the input line. In another embodiment, the first and second control lines are disposed on opposite sides of the input line and generally parallel to the first and second output lines.

6 Claims, 9 Drawing Sheets

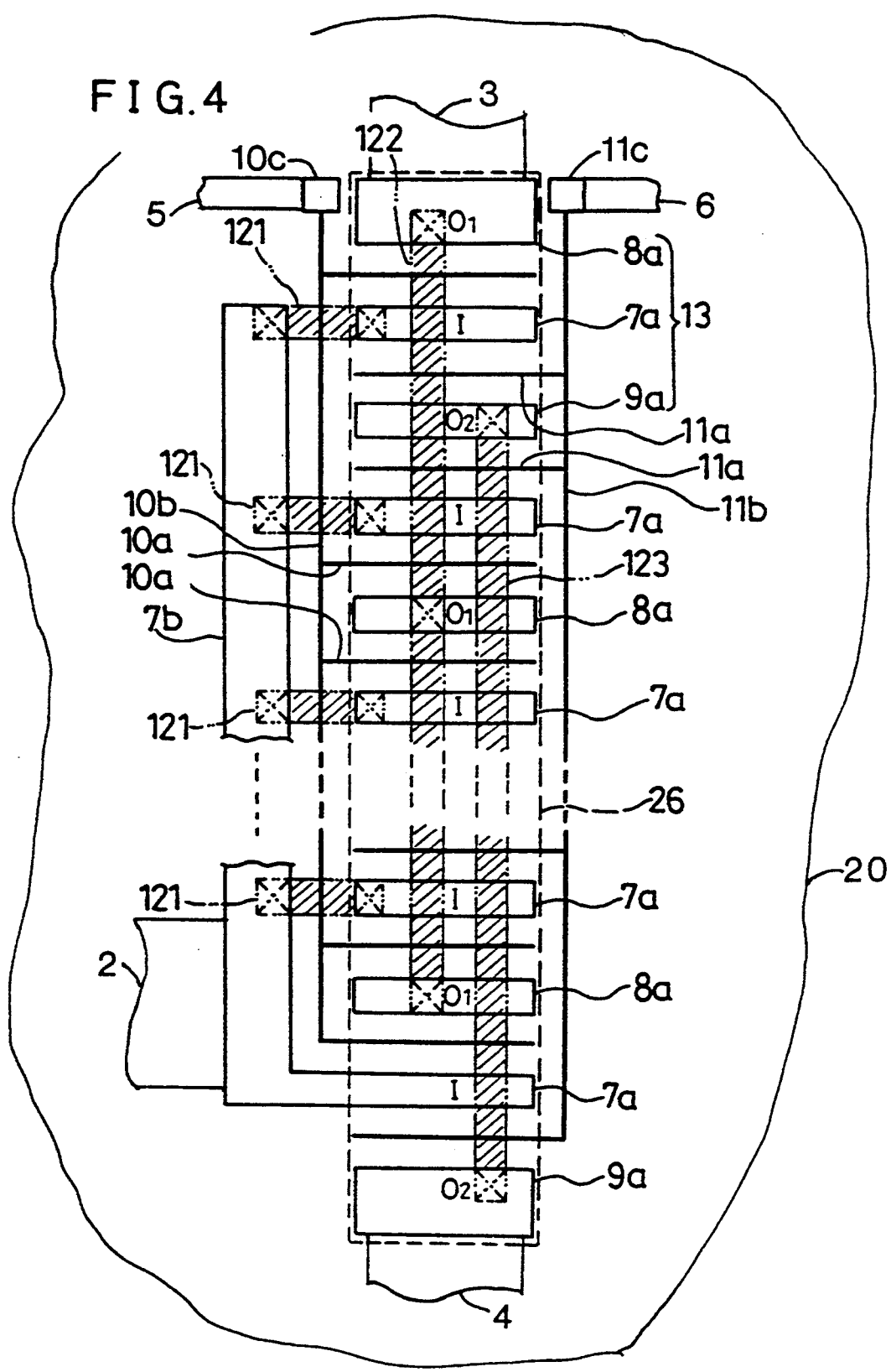

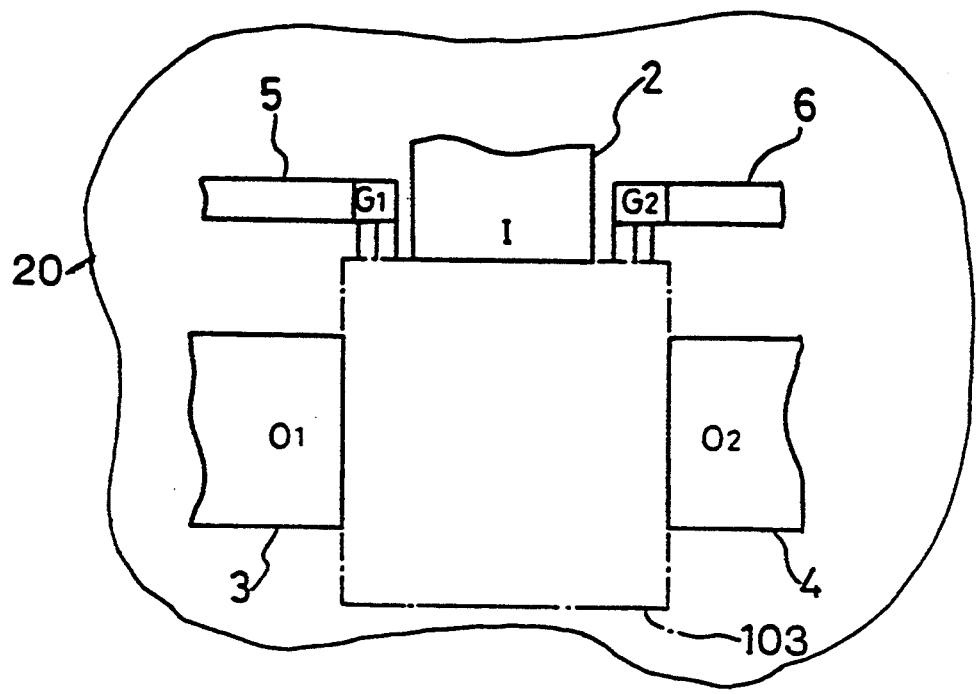
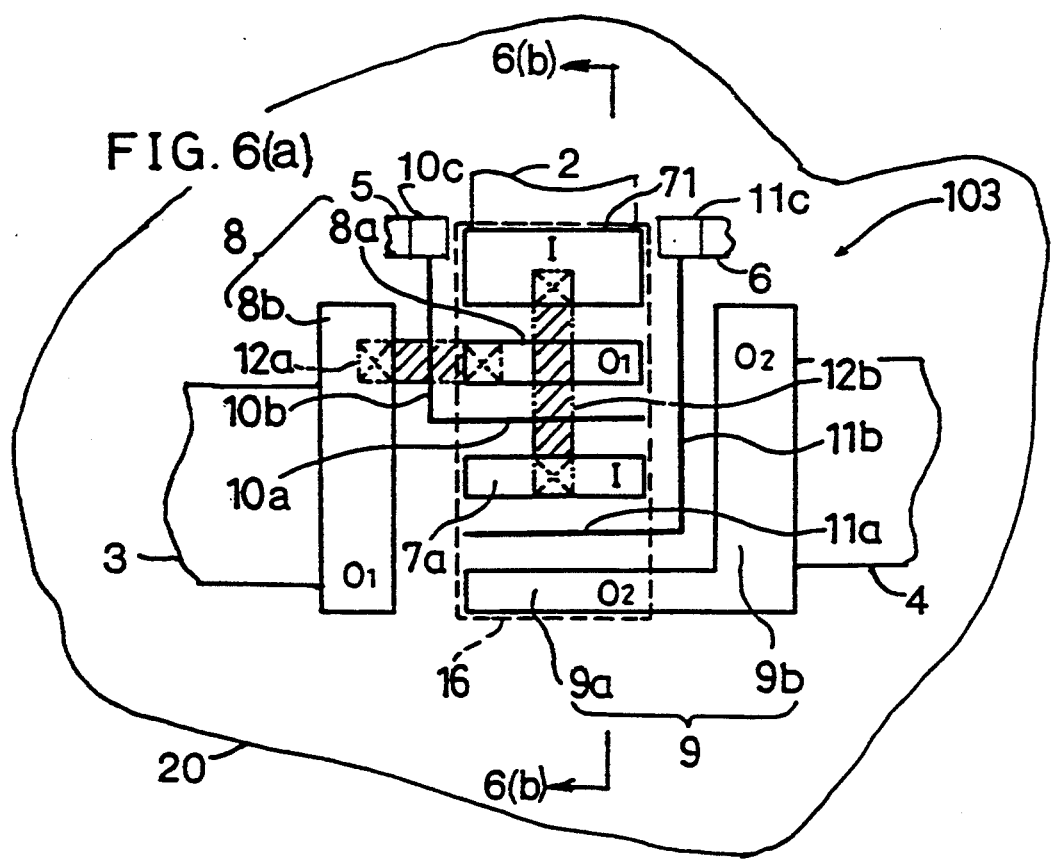

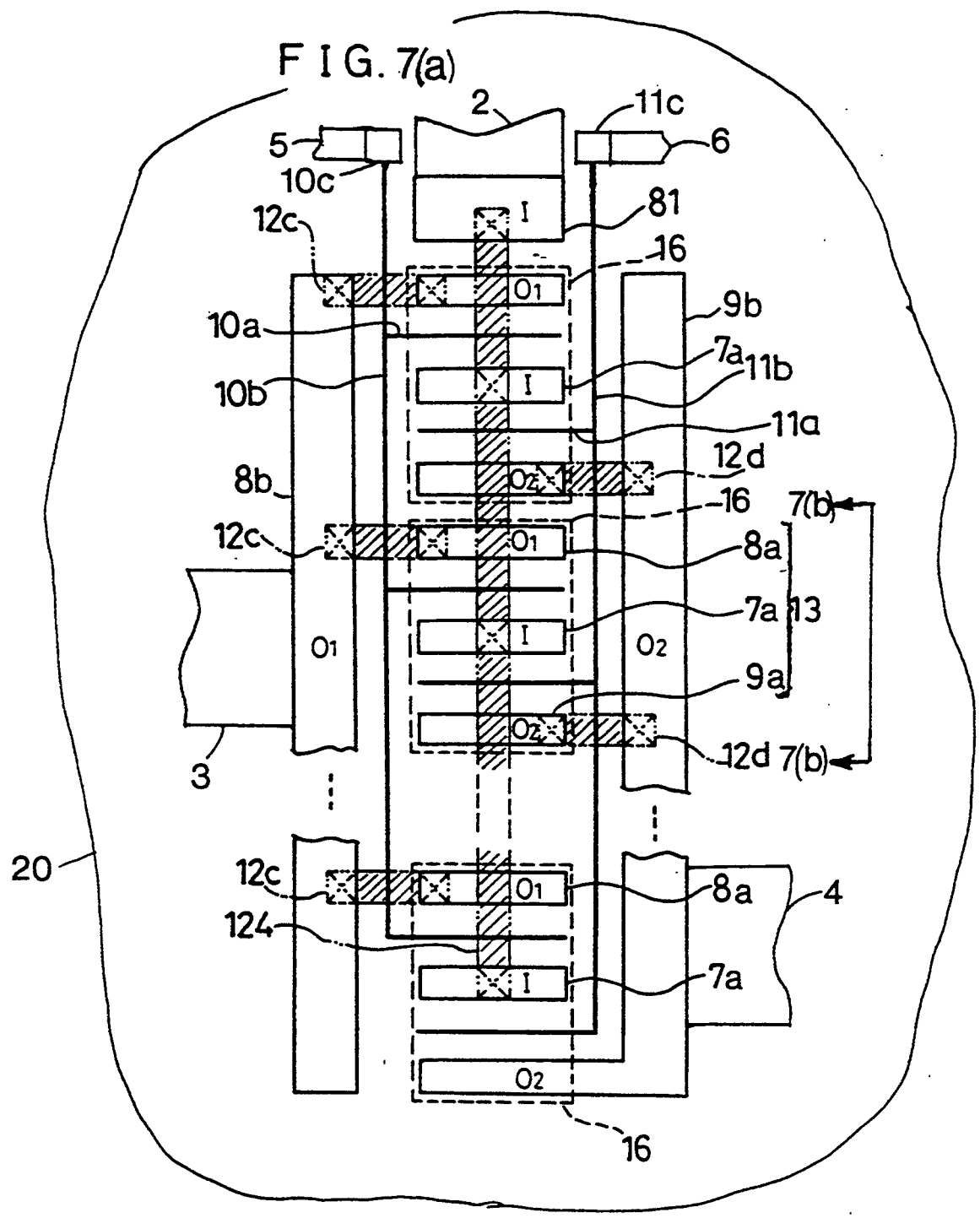

FIELD EFFECT TRANSISTOR SIGNAL SWITCHING DEVICE

This application is a continuation of application Ser. No. 07/766,121, filed Sep. 27, 1991.

FIELD OF THE INVENTION

The present invention relates to a field effect transistor signal switching device for selectively switching an input signal from an input line to a selected one of two output lines occupying a reduced area and including a variety of geometries for reducing design constraints in producing integrated circuits.

BACKGROUND OF THE INVENTION

FIG. 9 is a highly schematic plan view of a signal switching device 100 incorporating two field effect transistors (FETs) 17 and 18. The signal switching device of FIG. 9 includes an input line 2, first and second output lines 3 and 4, and control lines 5 and 6. For clarity, the input line 2 is labelled I and the first and second output lines 3 and 4 are labelled 01 and 02, respectively. The input, output, and control lines are electrically conducting metallizations or stripes, such as striplines, disposed on the substrate for conducting direct current and relatively high frequency signals. The input, output, and control lines as well as the FETs 17 and 18 are disposed on a semiconductor substrate 20 that is schematically illustrated in FIG. 9. Output lines 3 and 4 are disposed at opposed ends of the signal switching device and are perpendicular to the input line 2. In response to a control signal applied to control line 5, FET 17 controls whether an input signal supplied to input line 2 reaches the output of line 3. Likewise, the FET 18 controls, in response to a control signal applied to the control line 6, whether the input signal is transmitted to the output line 4.

The structure of the FET 17 is illustrated in detail in the plan view of FIG. 10. The FET 18 is symmetrical to the FET 17 and does not need separate illustration for understanding. In FIG. 10 and in the other figures, the same elements are given the same reference numbers. An active region 16 is disposed within substrate 20. As well known in the semiconductor arts, if the substrate 20 is a compound semiconductor, for example gallium arsenide, the substrate may be semi-insulating and the relatively low resistivity active region 16 may be formed by the ion implantation or diffusion of dopant impurities into the substrate or by another technique. An input electrode 7 includes a source electrode 7a disposed within the active region 16 on the substrate 20 and a source pad 7b disposed on the substrate 20 outside the active region 16. The source pad 7b is electrically connected to the source electrode 7a through an air bridge structure 12. As well known in the art, air bridge structures include an electrical conductor spaced from the surface of the substrate on which they are disposed that provides an electrical crossover path, i.e., an insulated separation, between two electrical conductors that cross each other. An electrically insulating material may be part of the air bridge structure and interposed between the insulated two electrical conductors but, preferably, in an air bridge structure the two electrical lines are separated by empty space.

An output electrode 14 includes a drain electrode 14a disposed on the semiconductor substrate 20 within the active region 16 and a drain pad 14b disposed on the substrate 20 outside the active region 16. A control electrode 15 includes a gate electrode 15a disposed on the substrate 20 within the active region 16, between the source and drain electrodes 7a and 14a, a gate pad 15c, and a connecting portion 15b connecting the gate electrode 15a to the gate pad 15c. The connecting portion 15b passes underneath the air bridge structure 12 and is electrically insulated from the conducting portion of the air bridge that provides an electrical connection between the source electrode 7a and the source pad 7b. As shown in FIG. 10, the input line 2 is connected to the source pad 7b, the output line 3 is connected to the drain pad 14b and the control line 5 is connected to the gate pad 15c.

The operation of the signal switching device in FIG. 9 is described with respect to the structure shown in FIG. 10 and a symmetrical structure comprising FET 18, although that symmetrical structure not shown in detail in the figures. When an input signal is applied to input line 2 for transmission to the output line 3, the FET 17 is made conductive, i.e., switched "on" by the application of a voltage, such as 0 volts, to the control electrode 15 of the FET 17 through the control line 5. At the same time, the FET 18 is made non-conductive, i.e., turned "off" by applying a voltage, for example −5 volts, to the control electrode of the FET 18 through the control line 6. The input signal is thereby transmitted to the output line 3 and is not transmitted to the output line 4. Likewise, if the control signals applied to control lines 5 and 6 are interchanged, the FET 17 is turned "off" and the FET 18 is turned "on" so that the input signal applied to input line 2 is transmitted to output line 4.

In the signal switching device described, two FETs are needed to switch the input signal between the two output lines. An active region must be formed for each of the two FETs and a relatively large area of the substrate 20 is required for the two FETs. Therefore it is difficult to reduce the area occupied by the signal switching device. In addition, the geometry of the signal switching device, i.e. the positional relationship of the input, output, and control lines, is limited, constraining the placement of components in the design of an integrated circuit including the device.

SUMMARY OF THE INVENTION

It is an object of the present invention to provide a field effect transistor signal switching device employing only one FET for switching an input signal selectively between two output signal lines.

It is another object of the invention to provide a signal switching device with a variety of input, output, and control line geometries for increased flexibility in designing integrating circuits including the signal switching device.

Other objects and advantages of the invention will become apparent from the detailed description that follows. The detailed description of specific embodiments of the invention are for illustration only, since various additions and modifications within the spirit and scope of the invention will be apparent to those of skill in the art from the detailed description.

According to one aspect of the invention, a field effect transistor signal switching device comprises a semiconductor substrate including an active region; an input electrode disposed on the substrate and including a source electrode disposed on the active region and a source pad; first and second output electrodes respectively including first and second drain electrodes disposed on the active region; and first and second control electrodes disposed on the substrate for controlling the selective transmission of an input signal applied to the input electrode to the first and second output electrodes, the first and second control electrodes respectively including first and second gate electrodes disposed on the active region between the source electrode and the first and second drain electrodes, respectively, first and second gate pads, and first and second connecting portions disposed on the substrate respectively electrically connecting the first and second gate electrodes to the first and second gate pads.

In one embodiment, the signal switching device includes an input line disposed on the substrate and electrically connected to the source pad, first and second output lines disposed on the substrate and electrically connected to the first and second output electrodes, respectively, first and second control lines disposed on the substrate and electrically connected to the first and second gate pads, respectively, wherein the first and second output lines are disposed on opposite sides of the signal switching device and the input line is generally perpendicular to the first and second output lines.

According to another aspect of the invention, a field effect transistor signal switching device comprises a semiconductor substrate including an active region; an input electrode disposed on the substrate and including a source electrode disposed on the active region and a source pad; first and second output electrodes disposed on the substrate including first and second drain electrodes disposed on the active region on opposite sides of the source electrode and first and second drain pads disposed outside the active region; first and second control electrodes disposed on the substrate for controlling the selective transmission of an input signal applied to the input electrode to the first and second output electrodes, the first and second control electrodes respectively including first and second gate electrodes disposed on the active region between the source electrode and the first and second drain electrodes, respectively, first and second gate pads, and first and second connecting portions disposed on the substrate respectively electrically connecting the first and second gate electrodes to the first and second gate pads; and a first air bridge structure electrically connecting the source electrode to the source pad and a second air bridge structure electrically connecting the first drain electrode to the first drain pad, the second drain electrode being electrically connected to the second drain pad.

In an embodiment of the invention, the signal switching device includes an input line disposed on the substrate and connected to the source pad, first and second output lines disposed on the substrate and electrically connected to the first and second drain pads, respectively, first and second control lines disposed on the substrate and electrically connected to the first and second gate pads, respectively, wherein the first and second output lines are disposed on opposite sides of the switching device and the input line is generally perpendicular to the first and second output lines.

BRIEF DESCRIPTION OF THE DRAWINGS

FIG. 4 is a plan view of a signal switching device in accordance with an embodiment of the invention.

FIG. 5 is a plan view of a signal switching device in accordance with an embodiment of the invention.

FIG. 6(a) is a plan view and FIG. 6(b) is a cross-sectional view taken along line 6(b)—6(b) of FIG. 6(a) of an FET in accordance with an embodiment of the invention.

FIG. 7(a) is a plan view and FIG. 7(b) is a partial sectional view taken along line 7(b)—7(b) of FIG. 7(a) of a signal switching device in accordance with an embodiment of the invention.

DETAILED DESCRIPTION OF PREFERRED EMBODIMENTS

Figure 1:
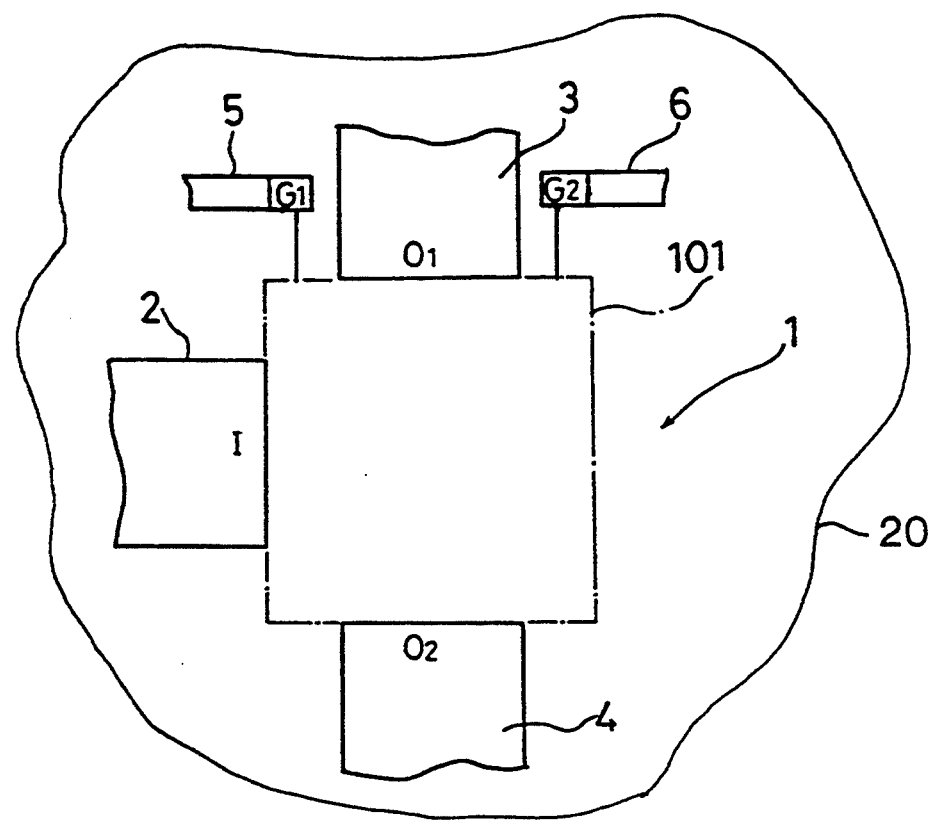
FIG. 1 is a plan view of a signal switching device in accordance with an embodiment of the invention.
Figure 9:
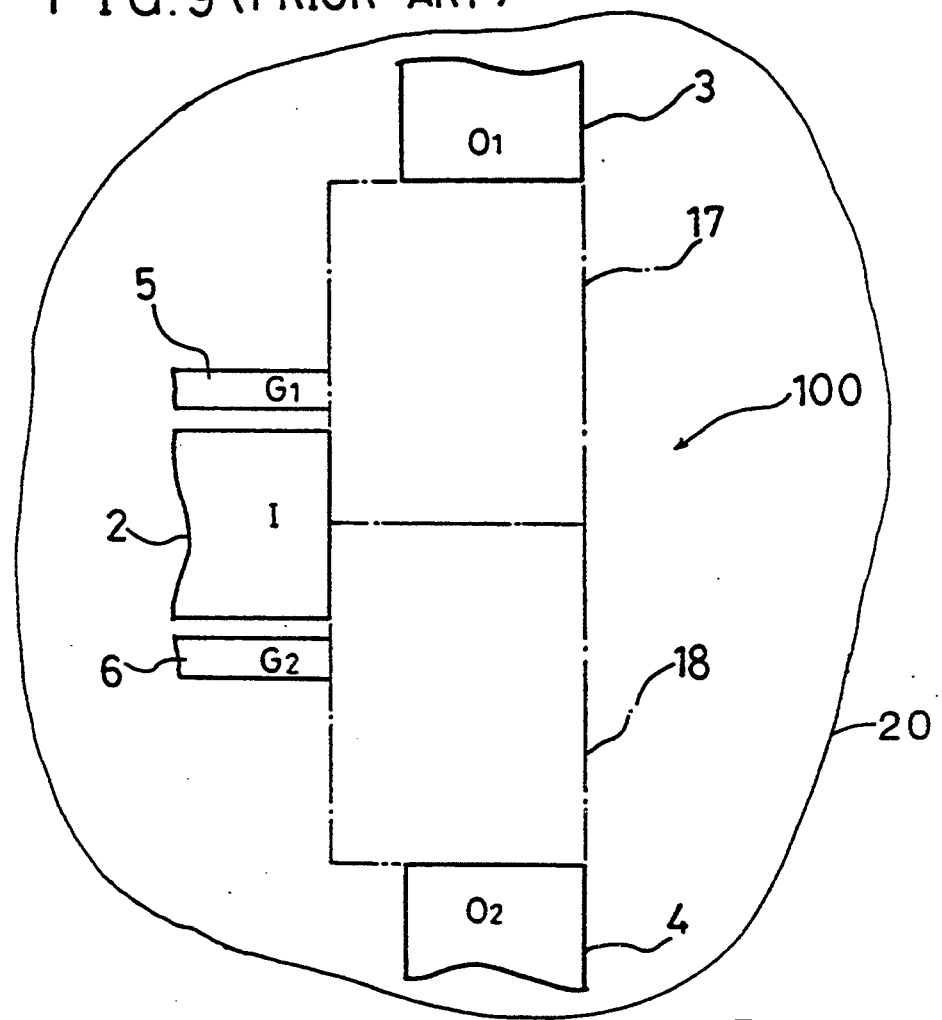
FIG. 9 is a plan view of a prior art signal switching device.

FIG. 1 is a plan view of an field effect transistor signal switching device 1 in accordance with an embodiment of the invention. Switching device 1 includes an FET 101. The other elements of the embodiment of the invention shown in FIG. 1 are the same as those identified by corresponding reference numbers in FIG. 9.

Figure 2A:
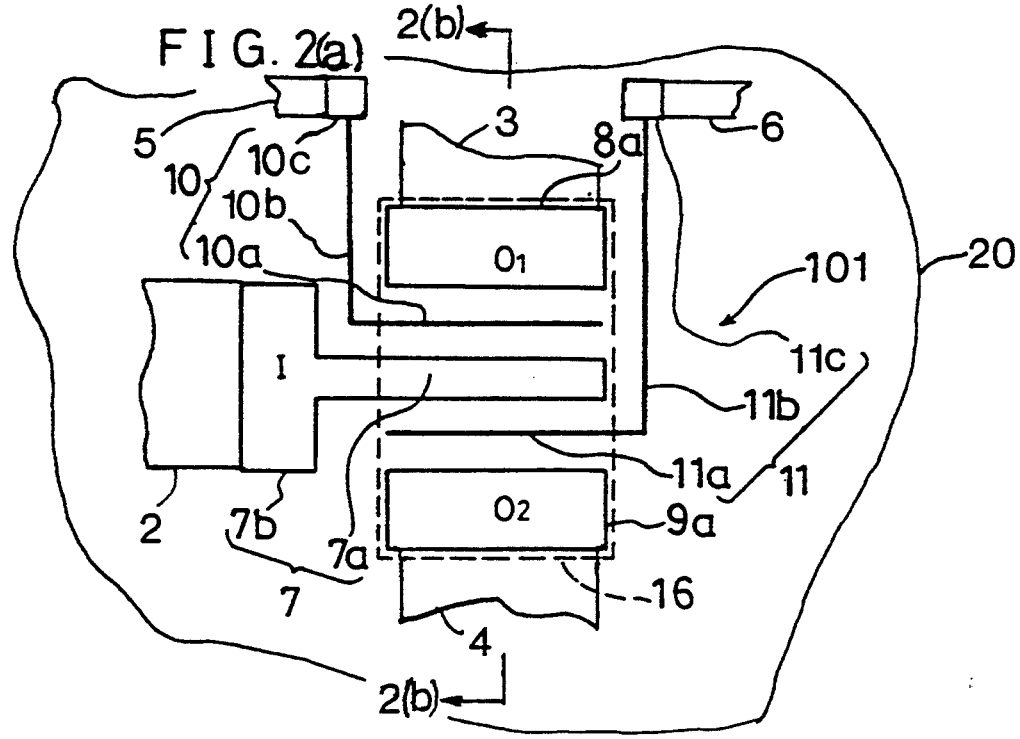
FIG. 2(a) is a plan view and FIG. 2(b) is a cross-sectional view taken along line 2(b)—2(b) of an FET in accordance with an embodiment of the invention.
Figure 2B:
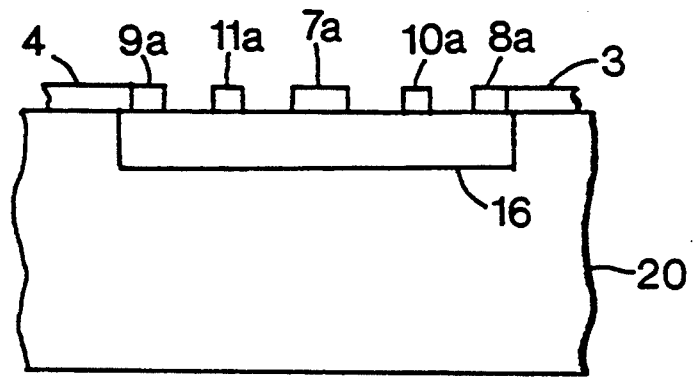
Figure 10:
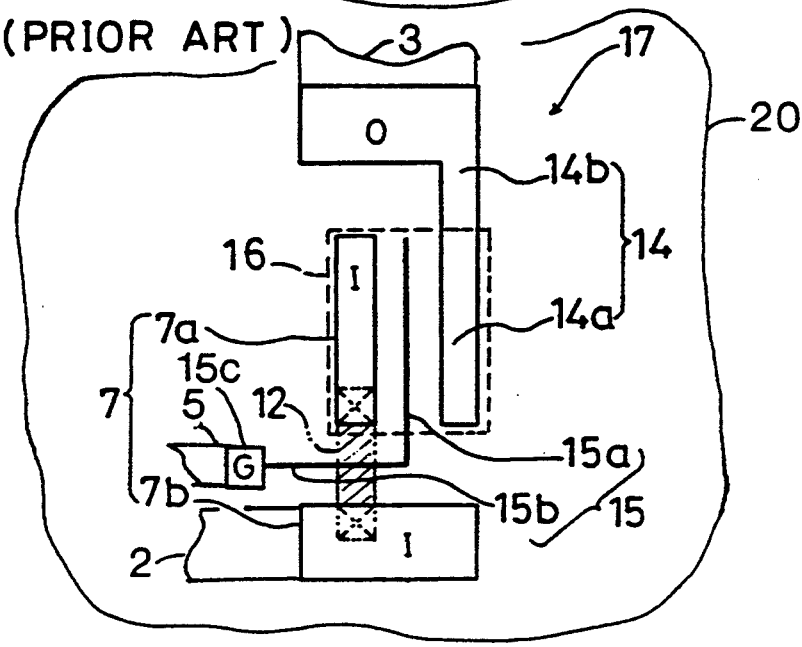
FIG. 10 is a plan view of an FET employed in the prior art signal switching device of FIG. 9.

An embodiment of an FET 101 used in the switching device 1 is shown in a plan view in FIG. 2(a) and in a sectional view in FIG. 2(b). The elements of the FET 101 that are the same as those elements described with respect to FIG. 10 are given the same reference numbers. The FET 101 includes an input electrode 7 comprising a source electrode 7a disposed on the active region 16 and a source pad 7b disposed on the substrate 20 outside the active region 16. A first drain electrode 8a and a second drain electrode 9a are disposed within the active region 16 on the substrate 20 on opposite sides of the source electrode 7a. A first control electrode 10 includes a gate electrode 10a, a connection portion 10b, and a gate pad 10c. The gate electrode 10a is disposed on the active region 16 between the source electrode 7a and the first drain electrode 8a. The connecting portion 10b electrically connects the gate electrode 10a to the gate pad 10c on the substrate 20 outside the active region 16. Similarly, a second control electrode 11 includes a gate electrode 11a disposed on the substrate 20 in the active region 16 between the source electrode 7a and the second drain electrode 9a. A connecting portion 11b of the control electrode 11 connects the gate electrode 11a to the gate pad 11c of the control electrode 11. The first and second control lines 5 and 6 are respectively connected to the gate pads 10c and 11c. The input line 2 is connected to the source pad 7b and the output lines 3 and 4 are respectively connected to the first and second drain electrodes 8a and 9a.

In the arrangement of FIGS. 1 and 2(a), the control lines 5 and 6 lie on opposite sides of one of the output lines, namely output line 3, and are generally parallel to the input line 2. The FET structure of FIG. 2(a) including two gate electrodes permits selective transfer of an input signal applied to the input line 2 to either of the output lines 3 and 4. The switching is achieved by applying complementary voltages to the gate electrodes 10a and 11a through the gate pads 10c and 11c. For example, a 0 voltage control signal may be applied to gate electrode 10a while a −5 volt control signal is applied to the gate electrode 11a. As a result, the input signal is transferred to the first drain electrode 8a, but not to the second drain electrode 9a. When the control signals are interchanged, the input signal is transferred only to the output line 4 and not to the output line 3. Thus, selective switching of an input signal between two different output lines is achieved with a single FET that includes two gate electrodes and two drain electrodes. The area required for the FET 101 is only about two-thirds as large as the area required for the two FETs 17 and 18 of the prior art structure of FIG. 9. Therefore, the area required for a signal switching device in accordance with the invention is reduced.

Figure 3B:
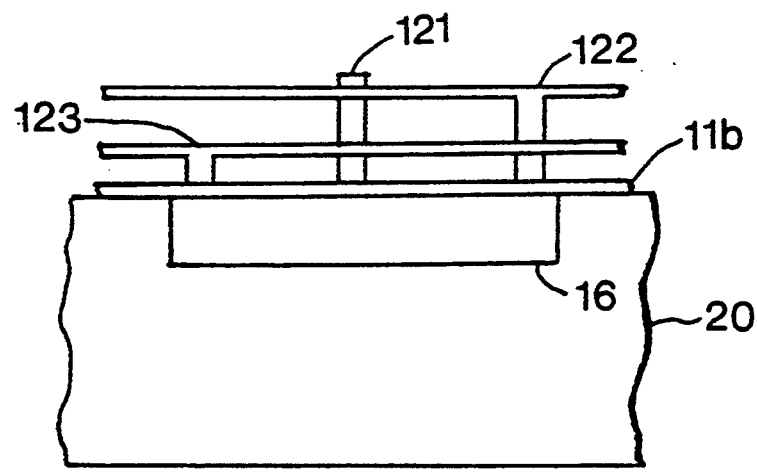
FIG. 3(a) is a plan view and FIG. 3(b) is a partial sectional view taken along line 3(b)—3(b) of FIG. 3(a) of a signal switching device in accordance with an embodiment of the invention.
Figure 3A:
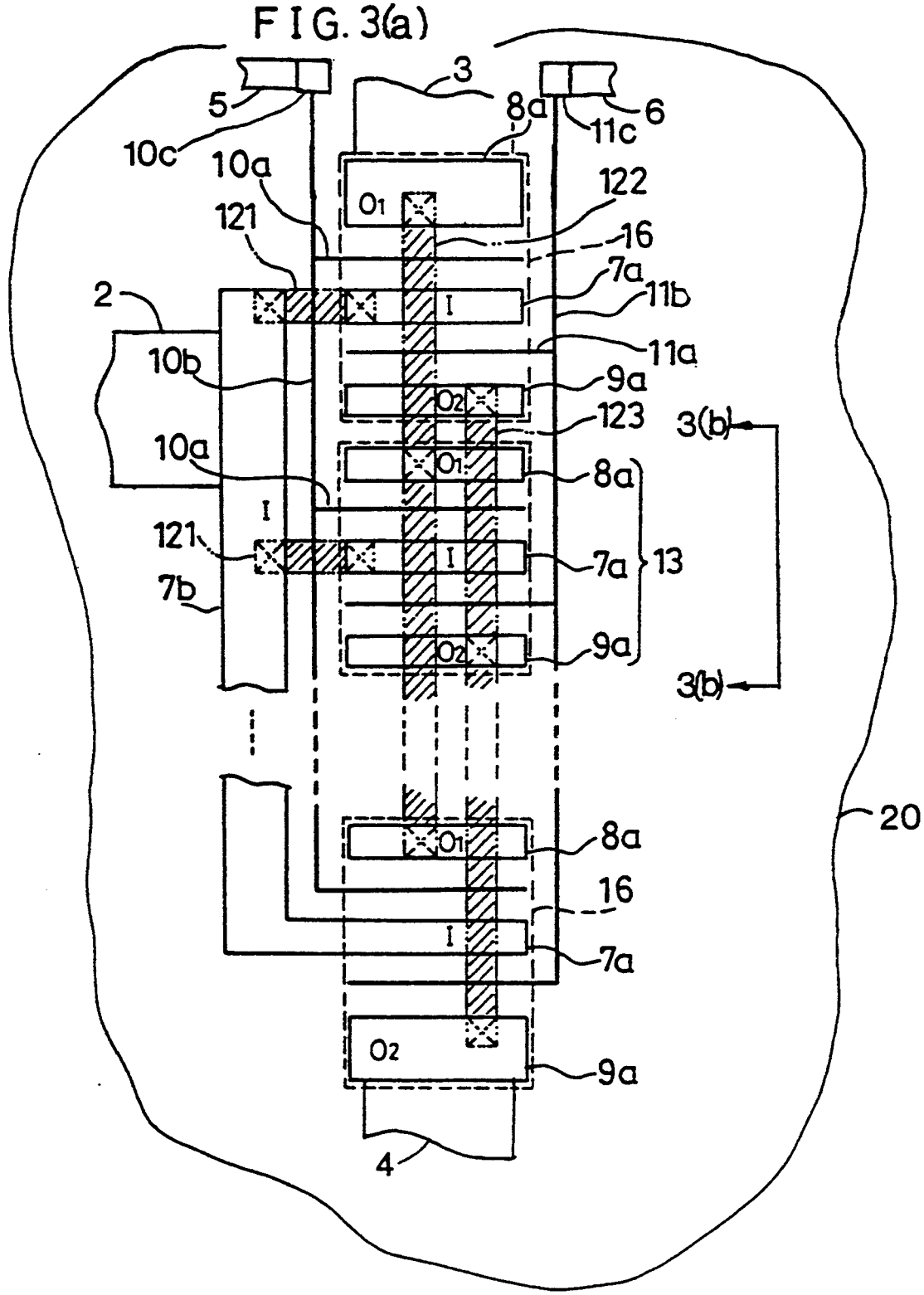

A plurality of the FETs 101 of FIG. 2 can be connected in parallel as a single, higher power capacity signal switching device in accordance with the invention. An embodiment of such a construction is shown in FIGS. 3(a) and 3(b). FIG. 3(b) is a partial cross-sectional view of the structure shown in plan view in FIG. 3(a) showing details of the air bridge construction described below.

In the multiple FET structure of FIGS. 3(a) and 3(b), the same elements are given the same reference numbers as in FIGS. 1 and 2(a). The structure of FIG. 3(a) includes individual FETs, such as the FET 13, each having a separate active region 16 in the substrate 20. Each individual FET includes first and second drain electrodes 8a and 9a, a centrally disposed source electrode 7a and gate electrodes 10a and 11a respectively disposed between the source electrode 7a and the first and second drain electrodes 8a and 9a. The source electrodes 7a are commonly connected to a source pad 7b through air bridge structures 121. One of the source electrodes 7a, the lowermost source electrode 7a in FIG. 3, is directly connected to the source pad 7b without using an air bridge structure 121. Those air bridge structures provide an electrical connection crossing over and insulated from the parallel interconnection of the gate electrodes 10a through the connecting portion 10b to the gate pad 10c. The first drain electrodes 8a of each of the individual FETs are connected together through an air bridge structure 122. That air bridge structure crosses over the gate electrodes 10a and 11a as well as the source electrodes 7a and second drain electrodes 9a without making electrical contact with them. Likewise, an air bridge structure 123 provides parallel interconnection of the second drain electrodes of the FETs. The interrelationship of these air bridge structures is best seen in FIG. 3(b). There, for clarity, the air bridge structures are shown as including interconnectors disposed at different heights above the surface of the substrate 20, but those different heights are not essentials and all air bridge conductors may lie in substantially the same plane. Finally, the gate electrodes 11a are electrically connected in parallel through the connecting portion 11b to the gate pad 11c.

The structure of FIG. 3(a), like the structures of FIGS. 1 and 2(a) has input and output lines 3 and 4 lying along the same general line and disposed perpendicular to the input line 1. The control lines 5 and 6 are generally perpendicular to the output lines 3 and 4 and generally parallel to the input line 1. The operation of the structure of FIG. 3(a) is identical to the operation of the structure of FIG. 2(a).

Yet another embodiment of a signal switching device according to the invention is shown in plan view in FIG. 4. The structure of FIG. 4 differs from the structure of FIG. 3(a) in two important respects. First, in the structure of FIG. 4, only a single, elongate active region 26 is present in the substrate 20 and a plurality of FETs is present in that common active region 26. Because of the use of a common active region 26 in the structure of FIG. 4, additional space savings over the structure of FIG. 3(a) is achieved although the possibility of signal leakage through an "off" FET is increased.

In the structure of FIG. 4, the source electrodes, the first and second drain electrodes, and the gate electrodes are arranged in a different sequence from that of FIG. 3. Each source electrode 7a is disposed between a first and a second drain electrode 8a and 9a. However, unlike the structure of FIG. 3(a), first and second drain electrodes are never directly adjacent to each other. Instead, the structure of FIG. 4 includes sequentially disposed repetitive units of a first drain electrode 8a, a first gate electrode 10a, a source electrode 7a, a second gate electrode 11a, a second drain electrode 9a, a second gate electrode 11a, a source electrode 7a, and a first gate electrode 10a, provided with an appropriate drain electrode at one end of a complete structure including a plurality of the units. In other words, in the structure of FIG. 4, gate electrodes are sequentially arranged in pairs of gate electrodes 11a and gate electrodes 10a.

As in the structure of FIG. 3(a), the gate electrodes 10a are all connected to the connecting portion 10b, i.e. in parallel, to the gate pad 10c. Likewise, the gate electrodes 11a are connected in parallel to the gate pad 11c through the connecting portion 11b. The source electrodes 7a are connected to the source pad 7b through the air bridge structures 121. The first drain electrodes 8a and the second drain electrodes 9a are respectively connected together, in parallel, by the air bridge structures 122 and 123, respectively.

With this structure and the respective source, first drain, second drain, first gate, second gate electrodes respectively connected parallel, a different operational arrangement from that of FIG. 3(a) is achieved. When the first gate electrodes 10a are biased to turn respective FETs "on" and the second gate electrodes 11a are biased to turn respective FETs "off", the input signal flows from two source electrodes 7a to the first drain electrode 8a disposed intermediate those two source electrodes. In other words, a single drain electrode collects current from each of two source electrodes. Likewise, when the control signals applied to the gate electrodes are interchanged, each adjacent second drain electrode 9a collects current from the two source electrodes 7a.

Another embodiment of a signal switching device according to the invention is shown in a schematic plan view in FIG. 5. The switching device of FIG. 5 is geometrically different from that of FIG. 1 and includes an FET 103 that is different in structure from the FET 101. In the structure of FIG. 5, the control lines 5 and 6 are generally parallel to the first and second output lines 3 and 4 instead of being perpendicular to those lines as in the structure of FIG. 1. In addition, the control lines 5 and 6 lie on opposite sides of the input line 2 rather than on the same side of the input line as in the embodiment of FIG. 1.

Figure 6B:
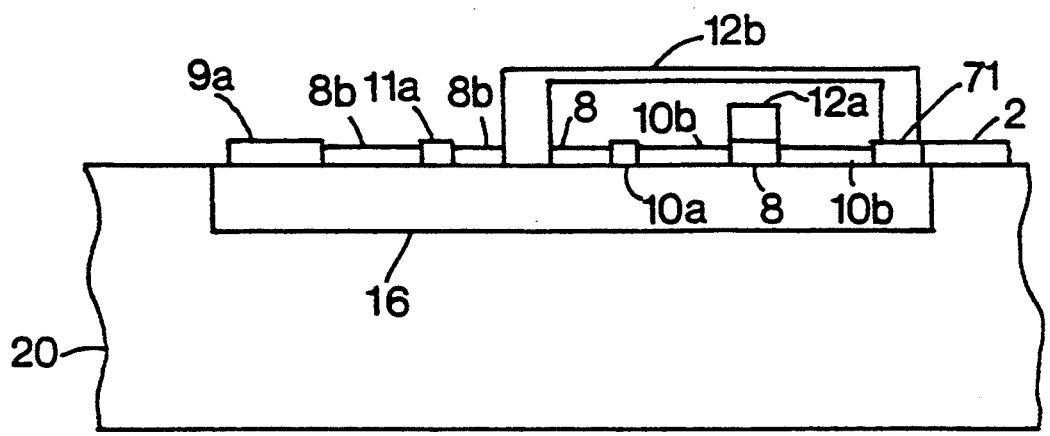

An FET structure for use in the signal switching device of FIG. 4 is shown in plan and sectional views in FIGS. 6(a) and 6(b). The FET 103, unlike the FET 101 of FIG. 2(a), includes air bridge structures to achieve the geometric arrangement of FIG. 5. In addition to the elements of FET 101 of FIG. 2(a), the FET 103 of FIG. 6(a) includes an auxiliary source electrode 71 disposed at one end of the active region 16. The auxiliary source electrode 71 is connected by an air bridge structure 12b to the source electrode 7a that is disposed between the gate electrodes 10a and 11a. In effect, the auxiliary source electrode 71 supplants the source pad 7b. The first drain electrode 8a is electrically connected to a first drain pad 8b disposed on the substrate 20 outside the active region 16 by an air bridge structure 12a. A second drain electrode 9a is directly connected on the surface of the substrate 20 to a second drain pad 9b lying outside the active region 16. The operation of the FET structure 103 is identical to that of the FET 101 of FIG. 2 and thus does not need repeated description.

The geometrically complementary structures of FIGS. 2(a) and 6(a) permit an integrated circuit designer to choose a signal switching device having a geometry meeting the constraints of other circuitry elements. Thereby, the freedom in designing an integrated circuit including a signal switching device is improved.

Figure 7B:
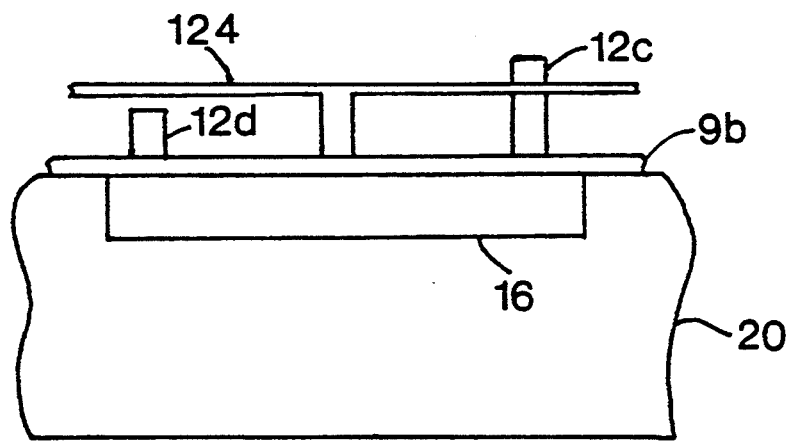

In FIGS. 7(a) and 7(b) plan and partial sectional views of a structure including a plurality of the FETs 103 of FIG. 6(a) connected in parallel is shown. The structure of FIG. 7(a) and 7(b) is analogous to the structure of FIGS. 3(a) and 3(b) in the same way that the structure of FIG. 6(a) is analogous to the structure of FIG. 2(a). Just as with the embodiment of FIG. 3(a), in the embodiment of FIG. 7(a), a larger signal handling capacity is achieved because of the parallel interconnection of a plurality of FETs. Otherwise, the operation of the structure of FIG. 7(a) is identical to that of FIG. 6(a).

In the structure of FIG. 7(a), each of the FETs has an individual active region 16. Air bridge structures 12c electrically connect the first drain electrode 8a of each of the FETs to drain pad 8b. Air bridge structure 12d electrically connects the second drain electrode 9a of each of the FETs to the drain pad 9b. One second drain pad 9a, the lowermost second drain pad in FIG. 7(a), is directly connected to the drain pad 9b without an air bridge structure. The air bridge structures insulate the first and second drain electrodes 8a and 9a from the connecting parts of 10b and 11b of the control electrodes 10 and 11. The gate electrodes 10a and 11a are respectively connected in parallel by the connecting portions 10b and 11b to the gate pads 10c and 11c, respectively. The source electrodes 7a are interconnected in parallel by an air bridge structure 124 that is connected to an auxiliary source pad 81 disposed on the substrate 20 outside the active region 16. The auxiliary source pad 81 replaces the source pad 7b of FIG. 3(a).

Figure 8:
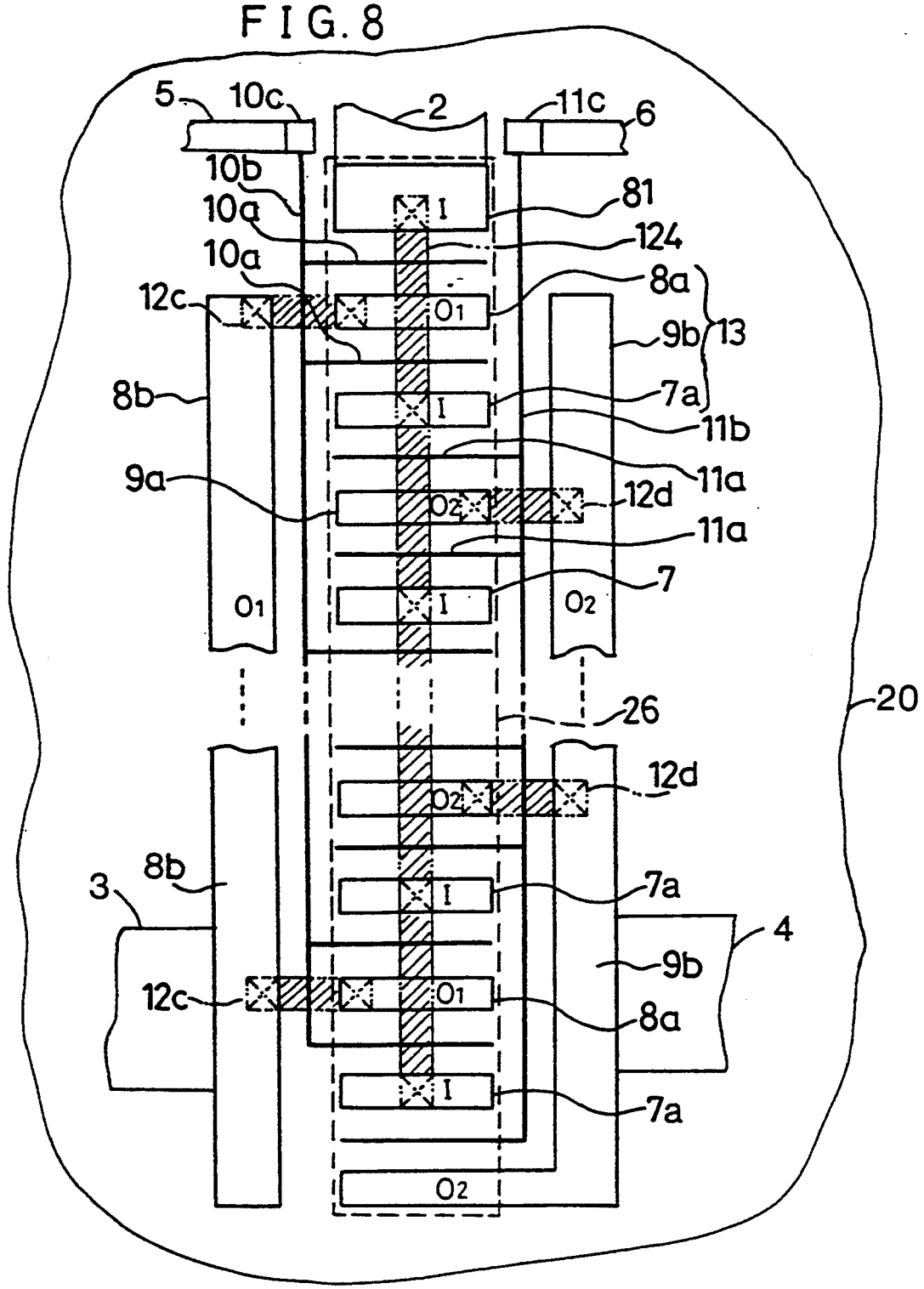
FIG. 8 is a plan view of a signal switching device in accordance with an embodiment of the invention.

Yet another embodiment of the invention is shown in a plan view in FIG. 8. The structure of FIG. 8 is analogous to the structure of FIG. 4 but those structures differ in the geometric arrangements of the input and output lines. Unlike the structure of FIG. 7(a), the structure of FIG. 8 includes a single, common active region 26 where the source, drain, and gate electrodes are present. A repetitive unit of the structure of FIG. 8 includes a first drain electrode 8a, a first gate electrode 10a, a source electrode 7a, a second gate electrode 11a, a second drain electrode 9a, a second gate electrode 11a, a source electrode 7a, and a first gate electrode 10a. These elements in repetitive units are sequentially disposed on the active region 26. The complete structure includes an appropriate drain electrode added at at least one end of the assembled units. Otherwise, the elements shown in FIG. 8 are the same as those identified and described with respect to FIG. 7(a) and do not need further description. Like the structure of FIG. 7(a), the respective gate electrodes, respective first and second drain electrodes, and the source electrodes in the structure of FIG. 8 are respectively electrically connected in parallel. The operation of the structure of FIG. 8 is the same as that of the structures of FIG. 4. In the structure of FIG. 8, the auxiliary source electrode 81 is disposed on the substrate 20 within the active region 26 rather than outside the active regions 16 as in the structure of FIG. 7(a). As with the structures of FIGS. 6(a) and 7(a), in the structure of FIG. 8 the control lines are generally parallel to the output lines 3 and 4 and are disposed on opposite sides of the input line 2.

In all of the structures described, the signal switching devices are constructed around single FETs including two gate electrodes for selectively controlling the transmission of a signal from an input line to one of two output lines. In some embodiments of the invention, FETs are connected in parallel to increase their signal handling capacity. Embodiments of the invention permit selection between various geometric positions of the control lines relative to the input and output lines, increasing the freedom of the integrated circuit designer. The invention may be constructed using various semiconductor materials and is not limited to a particular material. However, relatively high frequency signal switching devices may be realized using gallium arsenide or indium phosphide with striplines for the input, output, and control lines.

I claim:

1. A field effect transistor signal switching device comprising:

a semi-insulating semiconductor substrate including a plurality of spaced apart active regions having a low resistivity relative to the substrate serially arranged in the substrate;

an input electrode disposed on the substrate including a respective source electrode disposed on each of the active regions and a source pad;

first and second output electrodes respectively including a first drain electrode and a second drain electrode disposed on each of the active regions;

first and second control electrodes disposed on the substrate for controlling the selective transmission of an input signal applied to the input electrode to the first and second output electrodes, the first and second control electrodes respectively including a first gate electrode and a second gate electrode disposed on each of the respective active regions between the source electrode and the first and second drain electrodes of the respective active region, first and second gate pads, and first and second connecting portions disposed on the substrate respectively electrically connecting the first and second gate electrodes to the first and second gate pads; and a first air bridge structure electrically connecting the source electrodes to the source pad, a second air bridge structure electrically connecting the first drain electrodes together, and a third air bridge structure electrically connecting the second drain electrodes together.

2. The signal switching device of claim 1 including:

an input line disposed on the substrate and electrically connected to the source pad;

first and second output lines disposed on the substrate and electrically connected to the first and second drain electrodes, respectively; and first and second control lines disposed on the substrate and electrically connected to the first and second gate pads, respectively.

3. The signal switching device of claim 2 wherein the first and second output lines are disposed on opposite sides of the plurality of active regions, the input line is generally perpendicular to the first and second output lines, and the first and second control lines are generally parallel to the input line.

4. A field effect transistor signal switching device comprising:

a semi-insulating semiconductor substrate including a plurality of spaced-apart active regions having a low resistivity relative to the substrate serially arranged in the substrate;

an input electrode disposed on the substrate including a respective source electrode disposed on each of the active regions and a source pad;

first and second output electrodes disposed on the substrate including a first drain electrode and a second drain electrode disposed on each of the active regions on opposite sides of the source electrode of each respective active region and first and second drain pads disposed outside each respective active region;

first and second control electrodes disposed on the substrate for controlling the selective transmission of an input signal applied to the input electrode to the first and second output electrodes, the first and second control electrodes respectively including a first gate electrode and a second gate electrode disposed on each of the active regions between the respective source electrode and the first and second drain electrodes of the respective active region, first and second gate pads, and first and second connecting portions disposed on the substrate respectively electrically connecting the first and second gate electrodes to the first and second gate pads; and a first air bridge structure electrically connecting the respective source electrodes to the source pad and a second air bridge structure electrically connecting the respective first drain electrodes to the first drain pad, and a third air bridge structure electrically connecting the second drain electrodes to the second drain pad.

5. The signal switching device of claim 4 including:

an input line disposed on the substrate and electrically connected to the source pad;

first and second output lines disposed on the substrate and electrically connected to the first and second drain pads, respectively; and first and second control lines disposed on the substrate and electrically connected to the first and second gate pads, respectively.

6. The signal switching device of claim 5 wherein the first and second output lines are disposed on opposite sides of the plurality of active regions, the input line is generally perpendicular to the first and second output lines, and the first and second control lines are generally parallel to the input line.

* * * * *